(12) United States Patent
Fok et al.

(10) Patent No.: US 10,541,661 B2
(45) Date of Patent: Jan. 21, 2020

(54) CONTINUOUSLY TUNABLE AND HIGHLY RECONFIGURABLE MULTIBAND RF FILTER

(71) Applicant: University of Georgia Research Foundation, Inc., Athens, GA (US)

(72) Inventors: Mable P. Fok, Bishop, GA (US); Jia Ge, Athens, GA (US)

(73) Assignee: University of Georgia Research Foundation, Inc., Athens, GA (US)

(*) Notice: Subject to any disclaimer, the term of this patent is extended or adjusted under 35 U.S.C. 154(b) by 109 days.

(21) Appl. No.: 15/679,280

(22) Filed: Aug. 17, 2017

(65) Prior Publication Data
US 2018/0054175 A1    Feb. 22, 2018

Related U.S. Application Data

(60) Provisional application No. 62/376,576, filed on Aug. 18, 2016.

(51) Int. Cl.
*H03H 2/00* (2006.01)
*G02F 1/225* (2006.01)
*G02B 6/293* (2006.01)

(52) U.S. Cl.
CPC ............ *H03H 2/003* (2013.01); *G02F 1/225* (2013.01); *G02B 6/29302* (2013.01); *H03H 2250/00* (2013.01); *H04B 2210/006* (2013.01)

(58) Field of Classification Search
CPC .... H03H 2/003; H03H 2250/00; G02B 6/274; G02B 6/27; G02B 6/2726; G02B 6/2746;
(Continued)

(56) References Cited

U.S. PATENT DOCUMENTS

| 4,017,807 A * | 4/1977 | Hutcheson | .......... | H01S 3/08009 372/102 |
| 6,943,931 B1 * | 9/2005 | Dingel | .................. | G02F 1/2255 359/279 |

(Continued)

FOREIGN PATENT DOCUMENTS

WO     2016/145347 A1    9/2016

OTHER PUBLICATIONS

5Upradeepa, et al., "Comb-based radiofrequency photonic filters with rapid tunability and high selectivity", Nature Photonics, vol. 6, Mar. 2012, pp. 186-194.*

(Continued)

*Primary Examiner* — John R Lee
(74) *Attorney, Agent, or Firm* — Thomas Horstemeyer, LLP

(57) ABSTRACT

Various examples are provided for highly reconfigurable multiband radio frequency (RF) filters. The multiband RF filters can be continuously tunable. In one example, a multiband RF filter includes a Lyot loop filter that can generate an optical comb using an input optical signal from a tunable Mach-Zehnder interferometer (MZI), a birefringent device, and a polarization rotation angle of a polarization controller. The tunable MZI can include a tunable delay line that can adjust comb spacing of the optical comb. In another example, a multiband RF filter includes a second MZI in series with a first MZI. The second MZI can generate a second tunable output signal from a first tunable output signal from the first MZI. In another example, the multiband RF filter can include a third MZI in series with the second MZI. The third MZI can generate a third tunable output signal from the second tunable output signal.

20 Claims, 10 Drawing Sheets

Seven passbands of the MZI-Lyot filter based MWP multiband filter

| Number | Optical comb combination | Tap frequency spacing (Δω, pm) | Passband frequency (Ω₀, GHz) |
|---|---|---|---|
| #1 | Lyot 1 | 304.2 | 1.35 |
| #2 | Lyot 2 | 152.1 | 2.70 |
| #3 | MZI − Lyot 2 | 101.4 | 4.05 |
| #4 | MZI − Lyot 1 | 76.0 | 5.40 |
| #5 | MZI | 60.9 | 6.75 |
| #6 | MZI + Lyot 1 | 50.8 | 8.10 |
| #7 | MZI + Lyot 2 | 43.5 | 9.45 |

(58) Field of Classification Search
CPC ............ G02B 6/29379; G02B 6/29389; G02B 6/29395; G02B 6/12007; G02F 1/00; G02F 1/225; G02F 1/21; H04B 2210/006; H04B 1/7093; H04B 10/00; H01P 1/20; H01P 1/201; H01P 1/203; H01P 1/20327; H01P 1/20336; H01P 1/205; H01P 1/2053
See application file for complete search history.

(56) References Cited

U.S. PATENT DOCUMENTS

| | | | |
|---|---|---|---|
| 8,111,722 B1* | 2/2012 | Maleki | G02F 1/353 372/18 |
| 8,498,539 B1* | 7/2013 | Ilchenko | H04B 10/90 398/115 |
| 2003/0053747 A1* | 3/2003 | Cormack | G02B 6/2935 385/24 |
| 2003/0161568 A1* | 8/2003 | El-Refaei | G02B 6/02085 385/11 |
| 2003/0175036 A1* | 9/2003 | Mamyshev | H04B 10/505 398/188 |
| 2004/0251991 A1* | 12/2004 | Rahman | H01P 1/20 333/205 |
| 2005/0012978 A1* | 1/2005 | Ibe | H04B 10/505 359/279 |
| 2006/0120656 A1* | 6/2006 | Han | G02B 6/274 385/11 |
| 2009/0092350 A1* | 4/2009 | Gill | G02F 1/225 385/3 |
| 2011/0007383 A1* | 1/2011 | Gheorma | G02F 1/2255 359/326 |
| 2012/0229886 A1* | 9/2012 | Chen | H04B 10/506 359/326 |
| 2013/0183041 A1* | 7/2013 | Wan | H04B 1/28 398/81 |
| 2015/0207291 A1* | 7/2015 | Rickman | H01S 5/142 372/20 |
| 2016/0087716 A1* | 3/2016 | McKinney | H04B 10/079 398/25 |
| 2016/0116678 A1* | 4/2016 | Evans | G01J 1/4257 385/1 |
| 2016/0367132 A1* | 12/2016 | Yun | A61B 3/102 |
| 2018/0027314 A1* | 1/2018 | Fok | G02B 6/29389 370/497 |
| 2018/0054175 A1* | 2/2018 | Fok | G02F 1/225 |
| 2018/0062603 A1* | 3/2018 | Fok | G02B 6/29389 |

OTHER PUBLICATIONS

Fok, "Optical Processing Techniques for Advanced Fiber-Optic Communication Systems", The Chinese University of Hong Kong, Aug. 2007, 63 pages.*
Ge, J. & Fok, M.P., "Passband Switchable Microwave Photonic Multiband Filter" Scientific Reports, 5:15882, DOI: 10.1038/srep15882, pp. 1-8 (Nov. 2015).
Ge, J., Mathews, A. K., James, A. E. & Fok, M. P., "Optically controlled microwave photonic dual-band filter with ultrafast reconfigurable capability". CLEO: Science and Innovations, Optical Society of America, STh1 F.6, San Jose, CA (Jun. 2016).
Gao, L., Zhang, J., Chen, X., and Yao, J. P. Microwave photonic filter with two independently tunable passbands using a phase modulator and an equivalent phase-shifted fiber Bragg grating. IEEE Trans. Microw. Theory Techn. 62, 380-387, (Feb. 2014).
Hao, Chen; Xu, Zuowei; Fu, Hongyan; Zhang, Shiwei; Wu, Congxian; Wu, Hao; Xu, Huiying; Cai, Zhiping. Switchable and tunable microwave frequency multiplication based on a dual-passband microwave photonic filter. Opt. Express 23, 9835-9843, DOI: 10.1364/OE.23.009835. (Apr. 2015).
Long, Huang; Chen, Dalei; Zhang, Fangzheng; Xiang, Peng; Zhang, Tingting; Wang, Peng; Lu, Linlin; Pu, Tao; Chen, Xiangfei. Microwave photonic filter with multiple independently tunable passbands based on a broadband optical source. Opt. Express 23, 25539-25552, DOI: 10.1364/OE.23.025539. (Jul. 2015).
Jiang, Y., Shum, P.P., Zu, P., Zhou, J., Bai, G., Xu, J., Zhou, Z., Li, H. and Wang, S.. A selectable multiband bandpass microwave photonic filter. IEEE Photon. J. 5, 5500509-5500509 (Jun. 2013).
Choudhary, Amol; Aryanfar, Iman; Shahnia, Shayan; Morrison, Blair; Vu, Khu; Madden, Stephen; Luther-Davies, Barry; Marpaung, David; Eggleton, Benjamin J. Tailoring of the Brillouin gain for on-chip widely tunable and reconfigurable broadband microwave photonic filters. Opt. Lett. 41, 436-439, DOI: 10.1364/OL.41.000436. (Jan. 2016).

* cited by examiner

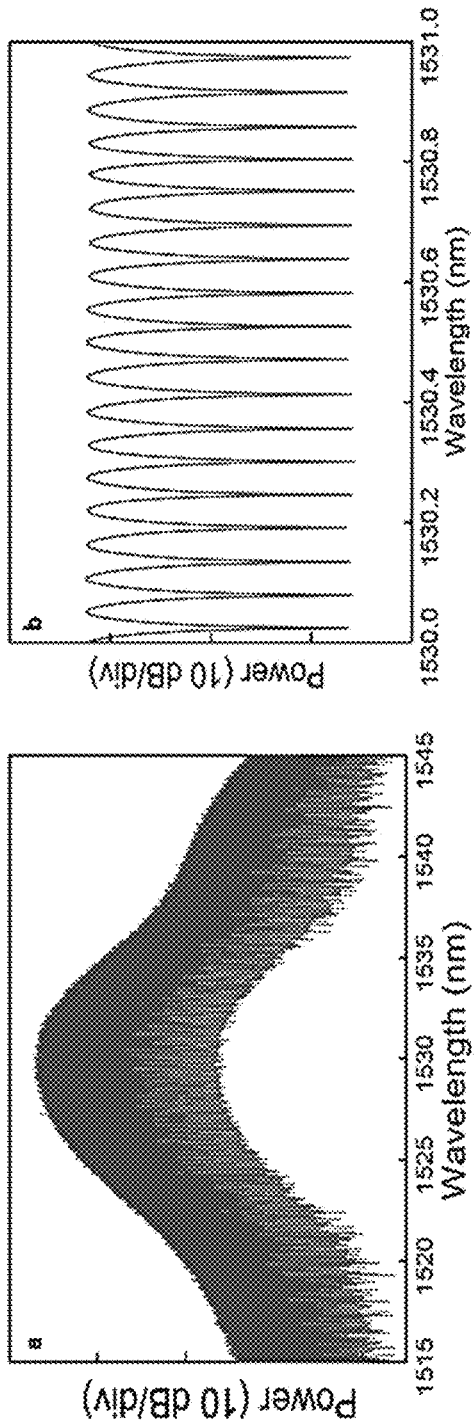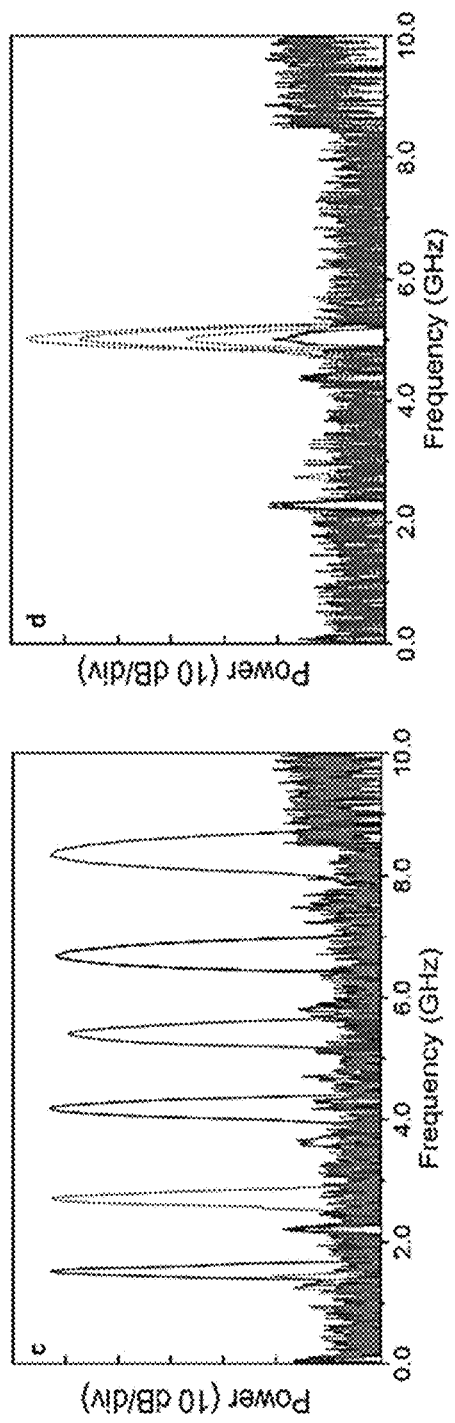

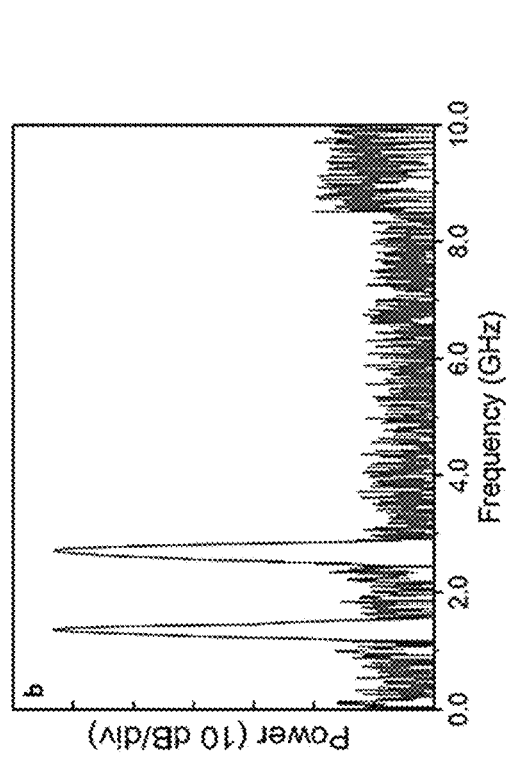
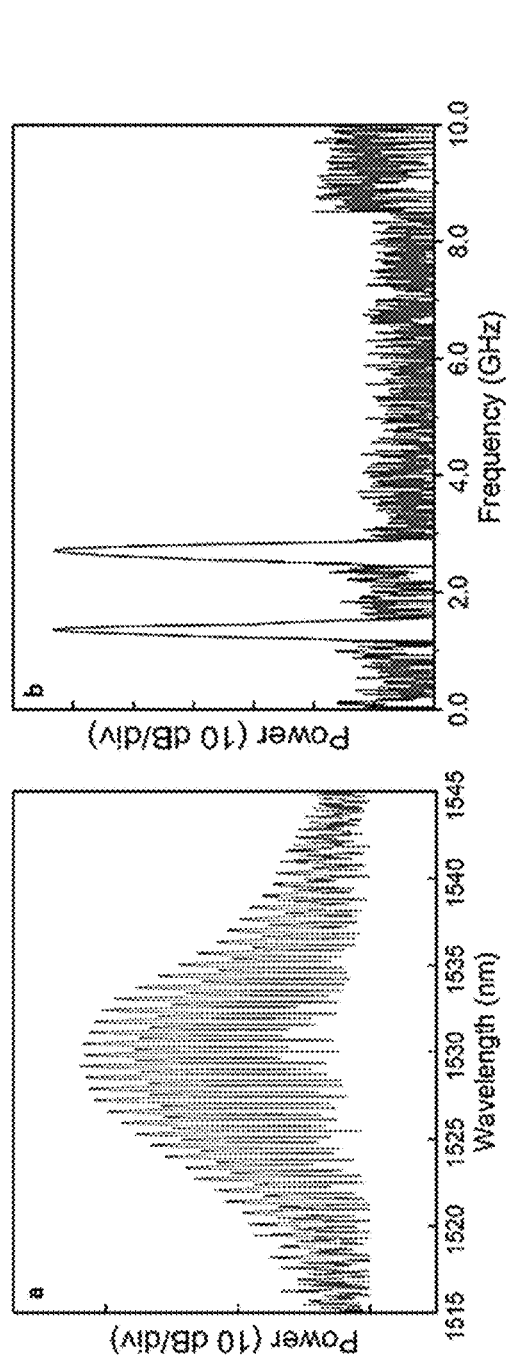
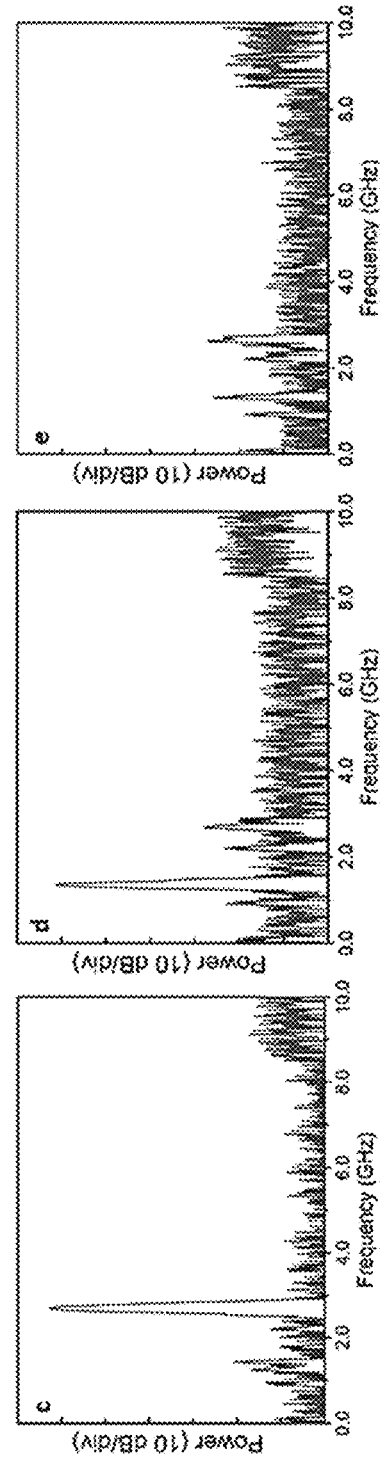

Seven passbands of the MZI-Lyot filter based MWP multiband filter

| Number | Optical comb combination | Tap frequency spacing ($\Delta\omega$, pm) | Passband frequency ($\Omega_0$, GHz) |
|---|---|---|---|
| #1 | Lyot 1 | 304.2 | 1.35 |
| #2 | Lyot 2 | 152.1 | 2.70 |
| #3 | MZI − Lyot 2 | 101.4 | 4.05 |
| #4 | MZI − Lyot 1 | 76.0 | 5.40 |
| #5 | MZI | 60.9 | 6.75 |
| #6 | MZI + Lyot 1 | 50.8 | 8.10 |
| #7 | MZI + Lyot 2 | 43.5 | 9.45 |

FIG. 5

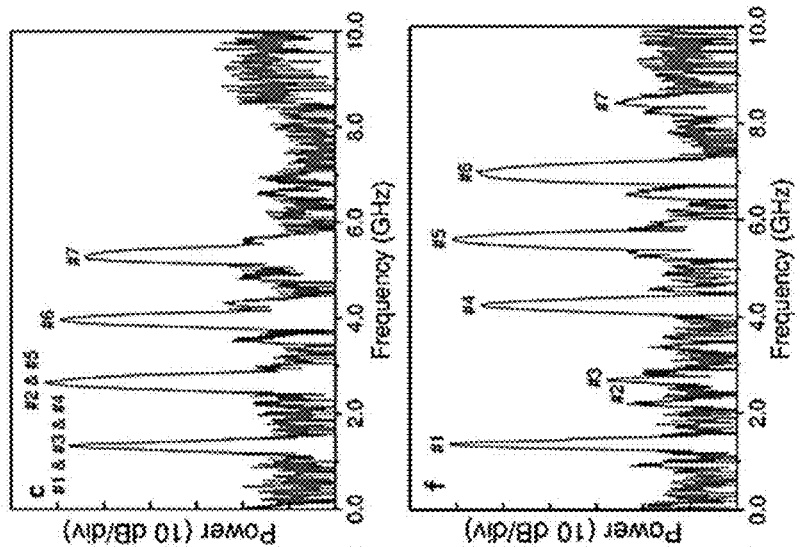
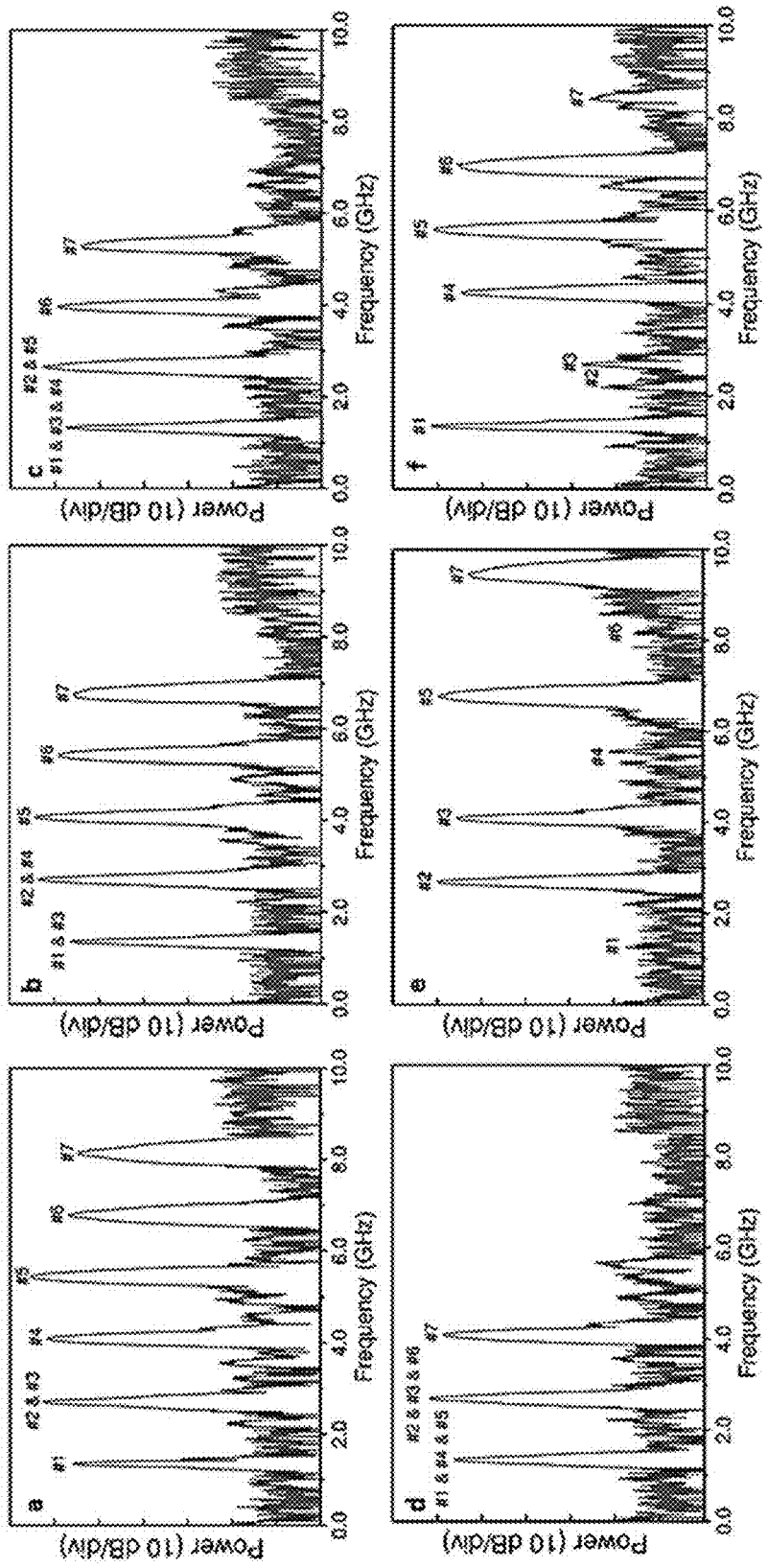
FIG. 6A  FIG. 6B  FIG. 6C
FIG. 6D  FIG. 6E  FIG. 6F

| Number | One MZI | Two MZIs | Three MZIs |
|---|---|---|---|
| 1 | | | $d_1 - d_2 - d_3$ |
| 2 | | $d_1 - d_2$ | $d_1 - d_2$ |
| 3 | | | $d_1 - d_2 + d_3$ |
| 4 | | | $d_1 - d_3$ |
| 5 | $d_1$ | $d_1$ | $d_1$ |
| 6 | | | $d_1 + d_3$ |
| 7 | | | $d_1 + d_2 - d_3$ |
| 8 | | $d_1 + d_2$ | $d_1 + d_2$ |
| 9 | | | $d_1 + d_2 + d_3$ |
| 10 | | | $d_2 - d_3$ |
| 11 | | $d_2$ | $d_2$ |
| 12 | | | $d_2 + d_3$ |
| 13 | | | $d_3$ |

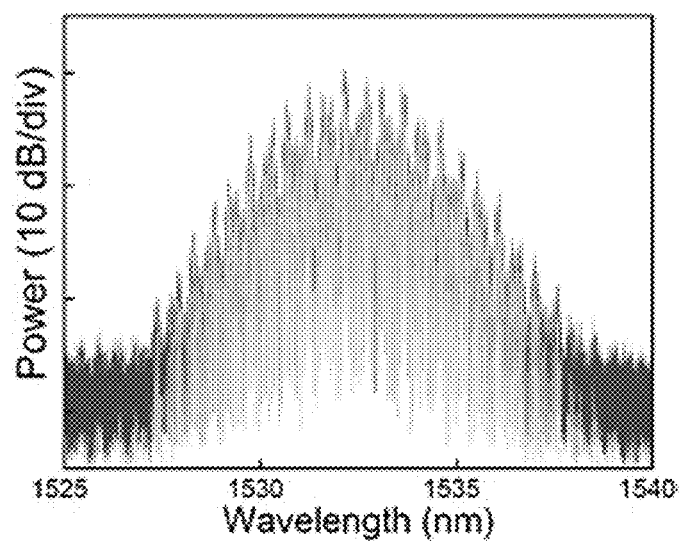
FIG. 8C
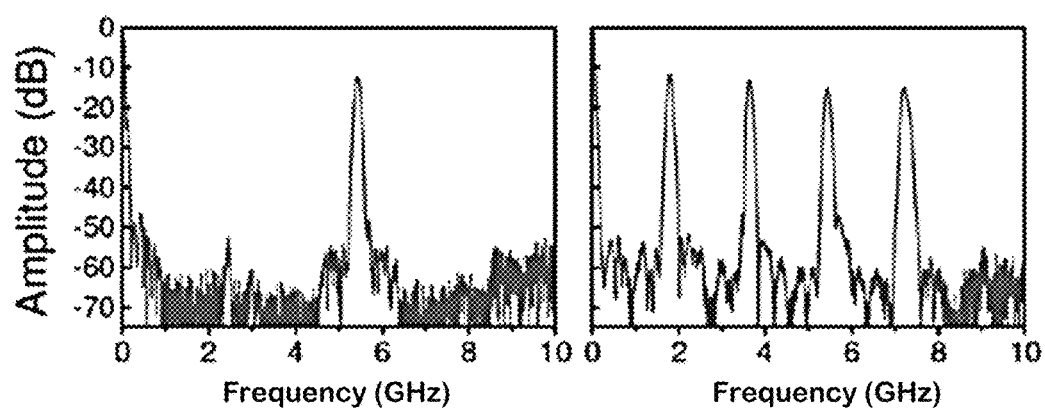
FIG. 9A  FIG. 9B

US 10,541,661 B2

CONTINUOUSLY TUNABLE AND HIGHLY RECONFIGURABLE MULTIBAND RF FILTER

CROSS REFERENCE TO RELATED APPLICATIONS

This application claims priority to, and the benefit of, U.S. provisional application entitled "Continuously Tunable and Highly Reconfigurable Multiband RF Filter" having Ser. No. 62/376,576, filed Aug. 18, 2016, which is hereby incorporated by reference in its entirety.

STATEMENT REGARDING FEDERALLY SPONSORED RESEARCH OR DEVELOPMENT

This invention was made with government support under agreement ECCS 1653525 and CMMI 1400100 awarded by the National Science Foundation. The Government has certain rights in the invention.

BACKGROUND

Due to the ever-increasing demand of multiband wireless and satellite systems, multi-service systems and multi-function devices, multiband communications are of critical need in various radio frequency (RF) systems. Multiband communications and frequency multiplexing are extremely useful to improve system spectral efficiency and multi-function capability, where several frequency channels over a wide RF range are implemented simultaneously to provide multiple functions and services. Thus, an RF bandpass filter with multiple passbands and that is highly reconfigurable is an important component for channel selection and prevent interference.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A through 2D show examples of optical comb spectra and passband frequency response of a tunable Mach-Zehnder (MZI) of the MWP multiband RF filter of FIG. 1 in accordance with various embodiments of the present disclosure.

FIGS. 3A through 3E show examples of optical comb spectra and passband frequency response of a Lyot loop filter of the MWP multiband RF filter of FIG. 1, in accordance with various embodiments of the present disclosure.

FIG. 4B illustrates a relationship between the passband frequency and time delay in the MWP multiband RF filter of FIG. 1.

FIG. 5 is a table illustrating an example of the passbands of the MWP multiband RF filter of FIG. 5, in accordance with various embodiments of the present disclosure.

FIGS. 6A through 6F illustrate examples of frequency spectra of the MWP multiband filter of FIG. 1 operating in various multi-passband states, in accordance with various embodiments of the present disclosure.

FIG. 8A is a schematic diagram of an example of a tunable and reconfigurable MWP multiband RF filter with cascaded MZIs, in accordance with various embodiments of the present disclosure.

FIGS. 8B and 8C illustrate examples of cascaded MZIs and a measured optical spectrum with three cascaded MZIs, respectively, in accordance with various embodiments of the present disclosure.

FIGS. 9A through 9H illustrate examples of measured RF amplitude response of the MWP multiband filter of FIG. 8A with various passband combinations, in accordance with various embodiments of the present disclosure.

DETAILED DESCRIPTION

Figure 1:
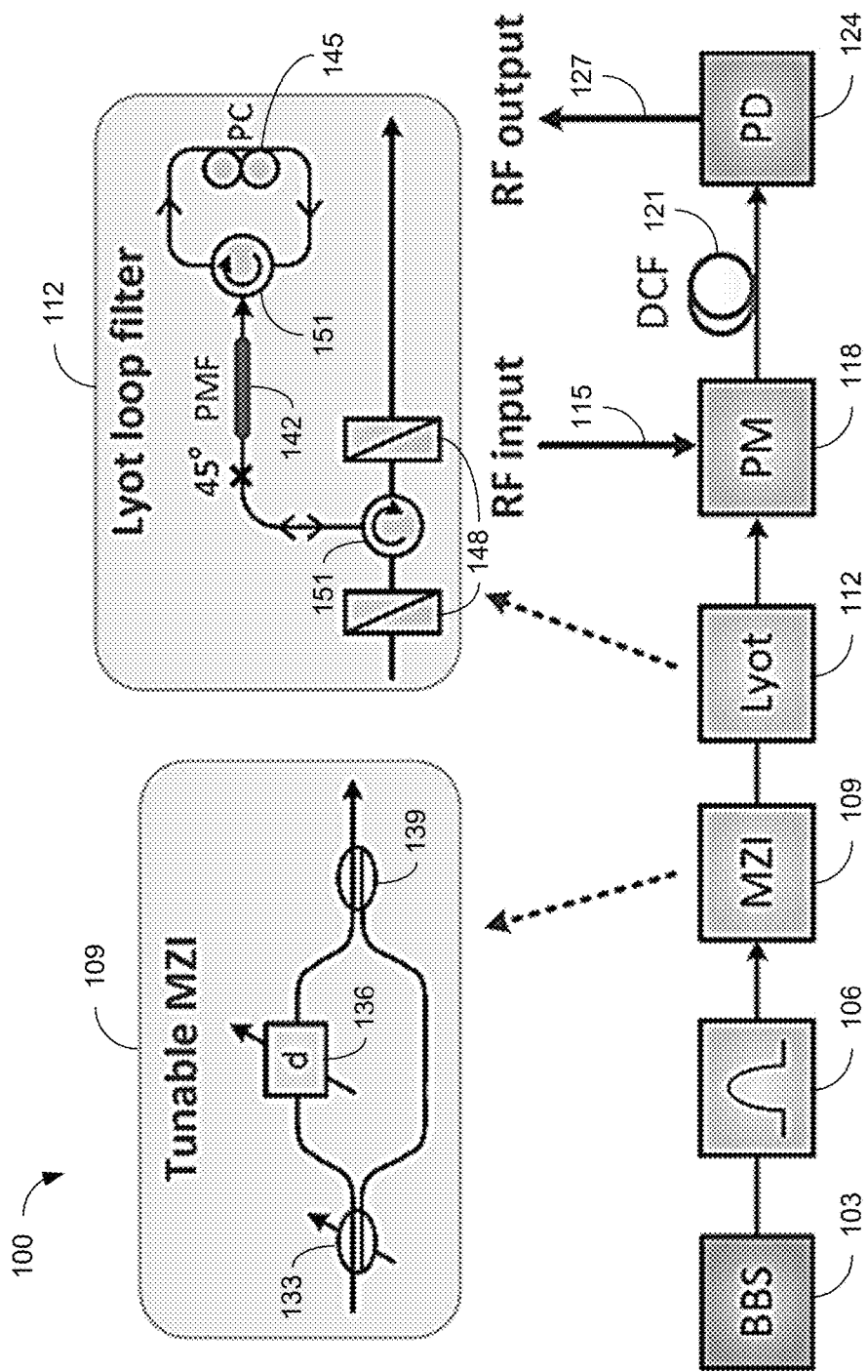
FIG. 1 is a schematic diagram of an example of a tunable and reconfigurable microwave photonic (MWP) multiband RF filter (or MWP multiband RF filter) in accordance with various embodiments of the present disclosure.

Disclosed herein are various embodiments of methods related to photonic implementations of highly reconfigurable multiband radio frequency (RF) filters. Reference will now be made in detail to the description of the embodiments as illustrated in the drawings, wherein like reference numbers indicate like parts throughout the several views.

Although the need is clear, achieving such reconfigurable functionality is very challenging due to the nature of conventional electronic techniques which lack flexible capabilities. It is also challenging to satisfy the design parameters for all passbands when a large number of simultaneous passbands are needed, which could result in non-uniform and inconsistent merits of different passbands. For state-of-the-art electronics based RF multiband filters, the maximum number of simultaneous passbands recorded has been six with fixed passband frequencies; with very few tunable tri-band and quad-band filters having been realized with limited tunablity. Although electronic approaches offer on-chip solutions, both the number of simultaneous passbands and passband tunability are limited. Photonics offers a promising way to implement RF multiband filters with flexible passband reconfigurability and frequency tuning capability.

Photonic technology has attracted considerable attention to achieve unique functions and enhance conventional RF systems, due to its unique properties such as wide operation bandwidth, flexible tunability and reconfigurability. Although highly tunable single passband filters have been developed, microwave photonic (MWP) multiband filters are still underdeveloped because of the challenges of obtaining multiple passbands using conventional MWP filter architectures. The increasing number of recent MWP multiband filter implementations illustrates both the great interest and the challenge of achieving multiband filters. For example, a MWP multiband filter with three switchable passbands can be achieved using three pieces of birefringence fibers. Several tunable MWP dual-band filter approaches can also be implemented. The use of a two-stage Lyot loop filter with a passband switchable MWP multiband filter having up to twelve simultaneous passbands has been demonstrated. However, the passbands can only be configured to 12 specific pre-designed frequency channels. To fulfill the functionality and flexibility needed in dynamic multiband systems, continuous tuning of the multiple passbands to cover a wide frequency range is highly desired and will significantly advance filter capability to the next level.

In this disclosure, a MWP multiband filter with continuously tunable and reconfigurable passbands is presented. The passband frequencies can be continuously tuned and can cover a large frequency range without any dead-points, while the number of simultaneous passbands is adjustable. The disclosed scheme is based on the utilization of a tunable Mach-Zehnder interferometer (MZI) and a reconfigurable Lyot loop filter to generate a high-order optical comb with variable comb spacing. As a result, the MWP multiband filter can operate in several states through the same system setup (e.g., a single-band state, an all-block state, and/or dual-band and multiband states) all with tunable and reconfigurable passbands.

An original RF multiband filter with such a highly-flexible operation capability and large number of tunable passbands is demonstrated. Furthermore, the combination of tunable MZI and reconfigurable Lyot loop filter demonstrates a general methodology for MWP multiband filter implementations for other existing MWP filter techniques. In the disclosed example, both the passband frequencies and the number of simultaneous passbands are adjustable, where one or multiple passbands are continuously tunable over a 35 GHz frequency range, and the number of simultaneous passbands is reconfigurable between zero to thirteen. As a result, the disclosed RF multiband filter can be configured with various passband combinations, providing exceptional operation flexibility. Additionally, excellent filter selectivity is obtained with over 35 dB sidelobe suppression and sharp passband profiles.

The tunable MZI brings the continuous tunability to the RF filter design and the Lyot loop filter provides the reconfigurability of the number of simultaneous passbands. Referring to FIG. 1, shown is a schematic diagram illustrating an example of a tunable and reconfigurable MWP multiband filter 100 based on a finite impulse response filter scheme, where a finite set of delayed and weighted signal taps are combined to implement the desired filter response. A broadband source (BBS) 103 is used as the light source of a broadband signal that is spectrally reshaped by a 30-nm wide optical Gaussian filter 106. The reshaped broadband signal is then spectrally sliced by a tunable Mach-Zehnder (MZI) 109 and a Lyot loop filter 112 to generate an optical frequency comb with variable comb spacings. In this way, the tunable MZI 109 provides continuous tunability of the comb spacings, while the Lyot loop filter 112 enables dynamic selection of the passband channels. The optical frequency comb works as a multi-wavelength optical carrier, which is then modulated by the RF input signal 115 through an electro-optic phase modulator (PM) 118. The modulated optical comb, now is the multi-tap signal, is then launched into a dispersive medium such as, e.g., a piece of dispersion compensating fiber (DCF) 121, for acquiring constant time delay difference between each of the filter taps. Each of the comb lines works as a single tap, which is temporally delayed by the DCF 121 and weighted by the Gaussian optical filter 106 to construct the desired MWP filter response. The weighted and delayed signal is then fed into a photo-detector (PD) 124 and converted back to a RF signal at the RF output 127.

The frequency response of the MWP filter 100 can be expressed as the addition of a series of weighted and delayed copies of the RF input signal 115, as illustrated in:

$$H(\Omega) \propto \sum_{n=1}^{N} P_n \cdot e^{-j\Omega nT}, \quad (1)$$

where $\Omega$ is the microwave frequency, N is the total tap number (number of comb lines) of the MWP multiband RF filter 100, $P_n$ is the power of the n-th tap from the optical comb, and T is the differential delay between each adjacent taps. The comb spacings ($\Delta\omega$) of the MZI 109 and Lyot loop filter 112 determine the carrier wavelength for each of the taps in the MWP multiband RF filter 100, which in turn determines the temporal delay T between taps as $T = \Delta\omega \cdot \beta_2 \cdot L_D$, where $\beta_2$ and $L_D$ are the group velocity dispersion and length of the DCF 121, respectively.

By apodizing the tap amplitudes with the broadband Gaussian optical filter 106, a bandpass response can be achieved in the RF domain and the sidelobes can be greatly suppressed, resulting in a clean and sharp bandpass profile with high main-to-sidelobe suppression ratio (MSSR). The passband frequency ($\Omega_0$) can be determined by:

$$\Omega_0 = \frac{2\pi}{\beta_2 L_D \Delta\omega}. \quad (2)$$

For a system that has a fixed dispersion, the passband frequency can only be adjusted by varying the frequency spacing of the filter taps ($\Delta\omega$). The 3-dB passband bandwidth is determined by:

$$\delta\Omega_{3dB} = \frac{\sqrt{8\ln 2}}{\beta_2 L_D \delta\omega}, \quad (3)$$

when dispersion slope of the DCF is neglected, where $\delta\omega$ represents the overall bandwidth of the optical comb. As shown, the 3-dB bandwidth ($\delta\Omega_{3dB}$) of the MWP multiband RF filter 100 is inversely proportional to the overall bandwidth of the optical comb and the dispersion of the DCF 121, which can be adjusted to fit the application needs.

Mach-Zehnder Interferometer Based Continuously Tunable MWP Single Bandpass Filter.

The performance of the tunable MZI 109 and its corresponding frequency response in the MWP multiband RF filter 100 was investigated by disabling the Lyot loop filter 112. As illustrated in the enlarged view of FIG. 1, the MZI 109 is a modified two-branch interferometer, which comprises a tunable coupler 133 at the input to adjust the power ratio of the two branches, and a tunable delay line 136 to vary the path length difference between the two branches. A standard 50:50 coupler 139 can be used to combine the two branches for interference. Based on the path difference d between the two branches, the two beams arrive at the coupler 139 with a phase difference such that different extent of constructive interference or destructive interference is resulted at each wavelength $\lambda$. The phase difference oat each wavelength and the comb spacing of the resultant optical comb filter is determined by:

$$\varphi(\lambda) = \frac{2\pi n_e d}{\lambda}, \quad (4)$$

$$\Delta \omega = \frac{2\pi c}{n_e d}, \quad (5)$$

where $n_e$ is the refractive index of the fiber used in the tunable MZI 109 and c is the speed of light.

Referring to FIG. 2A, shown is an example of the optical spectrum of the Gaussian profile optical frequency comb generated from the MZI 109. It illustrates the measured optical spectrum of the broadband source (BBS) 103 that is reshaped by the Gaussian optical filter 106 and spectrally sliced by the MZI 109. FIG. 2B provides a close-up view of a 1 nm portion of the optical comb, showing a comb spacing of 65 pm. FIG. 2C illustrates the measured frequency response of the single bandpass RF filter tuned to different frequencies. The corresponding RF response of the single bandpass RF filter was observed with the center frequency tunable over a wide frequency range by adjusting the comb spacing of the MZI 109 through the tuning of the delay line 136. A tunable optical coupler 133 with adjustable coupling ratios can be used to vary the power ratio between the two MZI branches, such that the amplitude of the resultant passband is dynamically tunable over a 58 dB range, which essentially can go down to the noise floor and effectively switching off the channel. FIG. 2D illustrated how the passband can be adjusted between the ON/OFF states.

Lyot Loop Filter Based Reconfigurable MWP Dual-Band Filter.

While the tunable MZI 109 generates a single passband filter and provides continuous tunability, system reconfigurability is provided by the Lyot loop filter 112. As illustrated in the enlarged view of FIG. 1, the Lyot loop filter 112 comprises a piece of polarization maintaining fiber (PMF) 142, a polarization controller (PC) 145, two aligned polarizers 148 and two optical circulators 151. The Lyot filter 112 allows the light to propagate through the PMF 142 twice bi-directionally through the circulators 151. Since the PMF 142 is a birefringent device, a phase difference of $\Delta\varphi = 2\pi BL/\lambda$ is obtained between the fast and slow axis when the light is aligned at 45° with respect to the fast axis, where B and L are the birefringence and length of the PMF 142, and λ is the wavelength of the light. By allowing the light to propagate twice in the PMF 142 through the circulator-PC loop (151/145) and adjusting the PC 145 to have a variable polarization rotation angles (Δθ) of 0°, 45°, or 90°, a total phase difference (σΔφ) of 2Δφ, Δφ and 0 can be obtained at the output, respectively. With different polarization rotation angles Δθ, the equivalent length ($L_e$) of the PMF is adjustable to 2L, L and 0, correspondingly, without physically changing the fiber length. As a result, an optical comb with switchable line spacings can be achieved, and the comb spacing is determined by the equivalent length of PMF 142, as shown in:

$$\Delta\omega = \frac{2\pi c}{BL_e}, \quad (6)$$

where c is the speed of light. The Lyot loop filter 112 can be set to have two interleaving combs simultaneously by setting Δθ to a value between 0° and 45°, such that the comb spacings generated from L and 2L are obtained at the same time. The optical comb provided to the PM can be amplified.

Referring to FIG. 3A, shown is an example of the optical spectrum of the Lyot loop filter 112 in a dual-band state. As illustrated in FIG. 3A, two different optical combs are interleaving with each other, with different comb spacings of 304.2 pm and 152.1 pm. Consequently, two passbands are generated at 1.35 GHz and 2.70 GHz in the RF domain with MSSR over 40 dB, as shown in FIG. 3B. By adjusting the polarization rotation angles in the circulator-PC loop (151/145), different comb spacing combinations in the optical comb can be achieved, and correspondingly each of the passbands can be independently switched ON or OFF. As a result, various operation states of the MWP multiband RF filter 100 can be obtained. FIG. 3C illustrates the generation of a single-band state with a passband at 2.70 GHz, FIG. 3D illustrates the generation of a single-band state with a passband at 1.35 GHz, and FIG. 3E illustrates the generation of an all-block state with no passbands.

Continuously Tunable and Reconfigurable MWP Multiband Filter Based on Cascaded MZI-Lyot Architecture.

The multiband RF filter utilizes the MZI-Lyot architecture to enable continuous tunability, multiband capability, and high reconfigurability of the passbands. The MZI 109 is a tunable first order comb filter, while the Lyot loop filter 112 is a reconfigurable second-order comb filter, thus, by cascading the MZI 109 and Lyot loop filter 112 together, a higher order comb filter with multiple comb spacings and reconfigurability can be achieved. As a result, the multiple passbands will be highly flexible and dynamic.

Figures 4A, 4B, 4C, 4D, 4E:
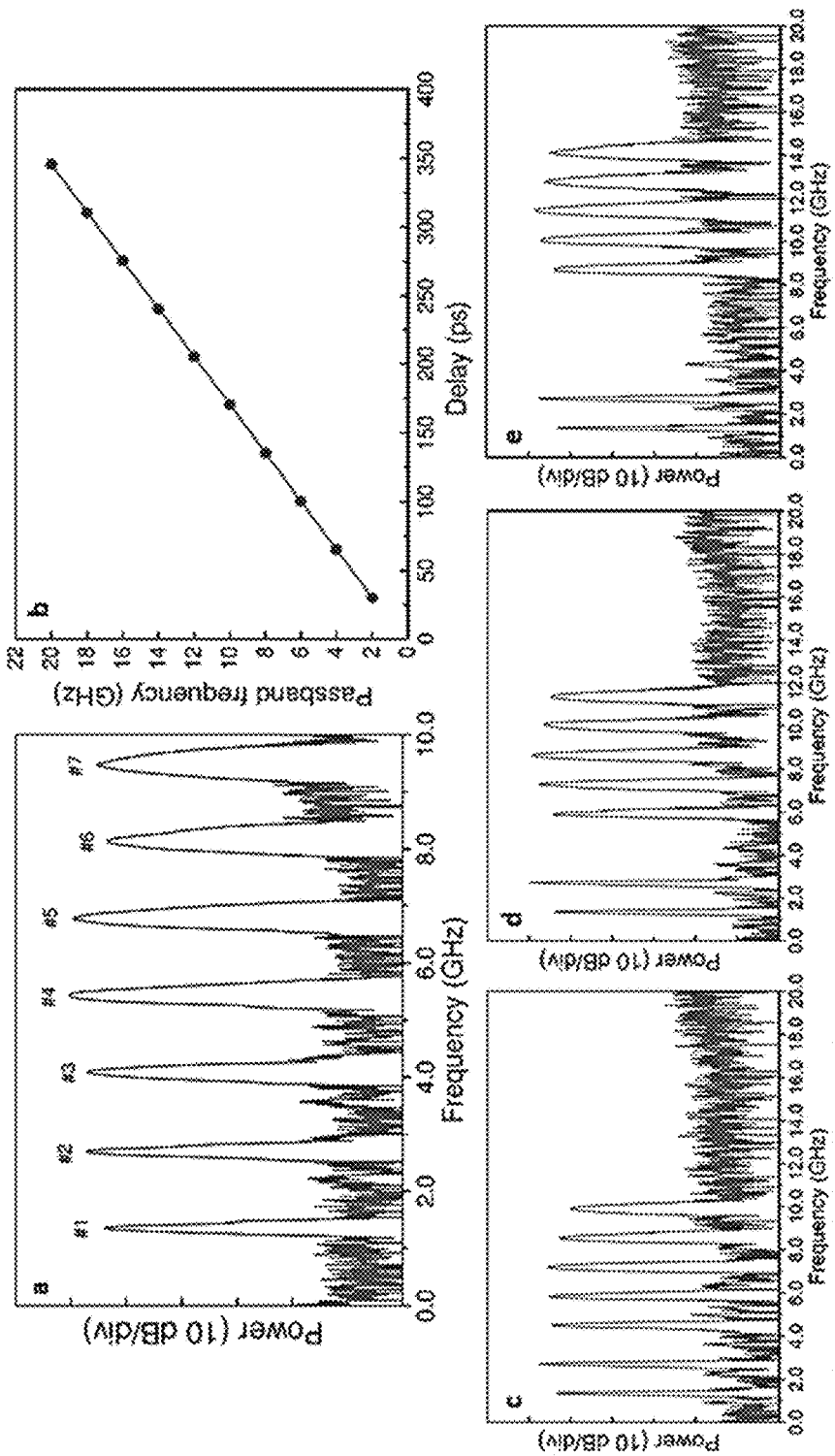
FIGS. 4A through 4E show examples of passband frequency response of the MWP multiband RF filter of FIG. 1, in accordance with various embodiments of the present disclosure.

Referring to FIG. 4A, shown is the measured frequency response tuning results of the MWP multiband RF filter, where seven passbands were generated at the same time (identified as #1 to #7). The seven single passbands are evenly distributed from 1.35 GHz to 9.45 GHz. Passbands #1 and #2 were generated directly from the comb lines of Lyot loop filter 112, as shown in FIG. 3B. Passband #5 was generated directly from the tunable MZI 109, and passbands #3, #4, #6 and #7 were generated by the addition and subtraction of the cascaded MZI 109 and Lyot loop filter 112, as described by the table in FIG. 5.

As can be seen from the table, passbands #4 and #6 were generated from the interaction between the first passband from Lyot loop filter 112 and MZI 109 (Lyot 1: #1 and MZI: #5), such that the frequency spacing between passbands #4 and #5 and passbands #5 and #6 is 1.35 GHz. This can be attributed to the interactions of "MZI−Lyot 1" and "MZI+Lyot 1," as shown in the table in FIG. 5. Correspondingly, passbands #3 and #7 are the cascading results of the second passband of Lyot loop filter 112 and MZI 109 (Lyot 2: #2 and MZI: #5), such that a frequency spacing of 2.70 GHz away from passband #5 exists. This can be attributed to the interactions of "MZI−Lyot 2" and "MZI+Lyot 2," as shown in the table in FIG. 5. The relationship between all seven passbands and their corresponding comb spacings generated from the cascaded MZI 109 and Lyot loop filter 112 are summarized in the table in FIG. 5, where the seven passbands are set to be evenly distributed within a 10 GHz range with the same frequency spacing of 1.35 GHz, as illustrated in FIG. 4A.

Since passband #5 is generated from a continuously tunable MZI 109, any passbands related to #5 are also continuously tunable. This includes passbands #3, #4, #5, #6 and #7. FIG. 4B shows the relationship of the passband frequency tuning in response to the time delay between the two branches of the MZI 109. FIGS. 4C, 4D and 4E illustrate the measured tuning performance of the right five passbands (#3 through #7) generated from the MZI 109 as they are tuned to higher frequencies. The passbands #3 to #7 can be continuously tuned over a frequency range of 20 GHz. The MSSR for all the passband was over 35 dB and the average 3-dB bandwidth was about 100 MHz, resulting a passband Q-factor of 200 at 20 GHz. The frequency spacing between each passband among the five tunable passbands was kept the same (1.35 GHz), which was determined by the length of the PMF 142 inside the Lyot loop filter 112. As shown in FIG. 4B, measured relationship between the passband frequency and the time delay between the two branches of the MZI 109 is linear. The maximum frequency tuning range was up to 35 GHz, and was determined by the adjustable range of the delay line 136.

Passband reconfigurability can be achieved by adjusting the polarization rotation angle $\Delta\theta$ inside the Lyot loop filter 112. Since each passband generated from the Lyot loop filter 112 can be independently switched ON or OFF, any passbands generated from Lyot 1 and Lyot 2 are also reconfigurable. From the table of FIG. 5, it can be seen that all the passbands except #5 are related to the Lyot loop filter 112 and, therefore, are all switchable between ON/OFF states. While passband #5 is also switchable itself through the control of the tunable optical coupler 133. Furthermore, since the right five passbands (#3 to #7) are continuously tunable, these passbands can be tuned to the frequencies such that they are overlapping with passbands #1 or #2, resulting in two passbands at the same frequency, and thus acting like one single passband.

FIGS. 6A-6F illustrate the operation of the MWP multiband RF filter 100 with different numbers of simultaneous passbands. The simultaneous passband number can be adjusted from three to seven, with different frequency combinations. The initial center frequencies of the passbands were set to be evenly distributed within 0 to 10 GHz, and the numbers of simultaneous passband are adjusted from six to three. FIGS. 6A through 6D were achieved by tuning the right five passbands (#3 to #7) to the same frequencies as Lyot 1 and Lyot 2 (passbands #1 & #2), such that up to three passbands were overlapping at the same frequency, consequently varying the simultaneous numbers of passband. FIG. 6A shows six passbands at 1.35 GHz, 2.70 GHz, 4.05 GHz, 5.40 GHz, 6.75 GHz and 8.10 GHz, with passbands #2 & #3 at the same frequency. FIG. 6B shows five passbands at 1.35 GHz, 2.70 GHz, 4.05 GHz, 5.40 GHz and 6.75 GHz, with passbands #1 & #3 and passbands #2 & #4 both overlapping. FIG. 6C shows four passbands at 1.35 GHz, 2.70 GHz, 4.05 GHz and 5.40 GHz, and FIG. 6D shows three passbands at 1.35 GHz, 2.70 GHz and 4.05 GHz. The passband overlapping in the RF domain resulted because the optical comb spacings were generated with the cascaded MZI-Lyot filter and the Lyot loop filter being the same.

Furthermore, the simultaneous number of passbands can be adjustable by switching off Lyot 1 or Lyot 2, such that a quad-band filter results, with one passband being fixed and the other three being tunable. By doing this the frequency spacings of the continuously tunable passbands can be adjusted between 1.35 GHz and 2.70 GHz, as shown in FIGS. 6E and 6F, respectively. FIG. 6E shows four passbands when Lyot 1 (at 1.35 GHz) is switched off, and FIG. 6F shows four passbands when Lyot 2 (at 2.70 GHz) is switched off. Since both the MZI 109 and Lyot loop filter 112 can be switched off separately, the number of simultaneous passbands can be adjusted to any value between zero and seven. The passband selection is based on the polarization state adjustment, high-speed and programmable tuning of the passbands may be achieved up to gigahertz speed with the use of an electrically tunable polarization controller or through an optical nonlinear polarization rotation effect. All of the passbands showed consistent performance with uniform and sharp passband profiles, and the passband qualities were well maintained during both the tuning and reconfiguring processes.

Figure 7A:
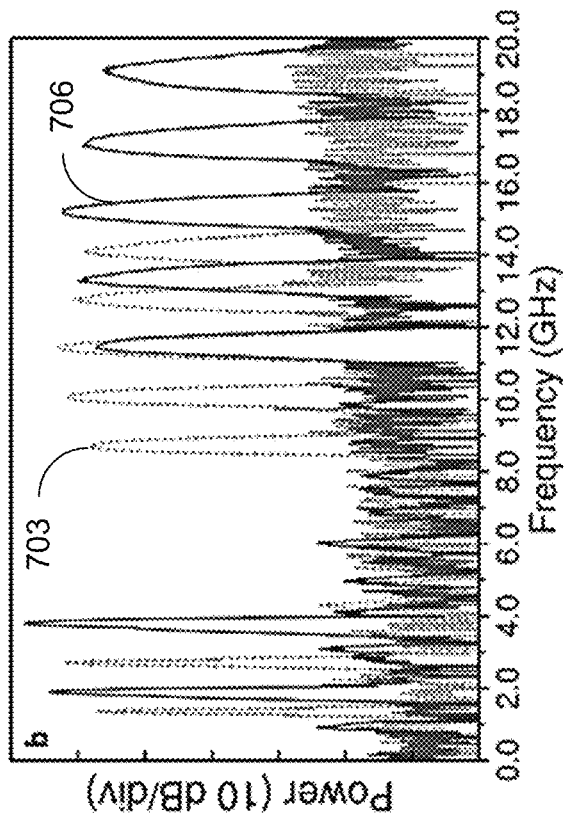
FIGS. 7A and 7B illustrate examples of tuning performance of passband bandwidth adjustment of the MWP multiband RF filter, in accordance with various embodiments of the present disclosure.
Figure 7B:
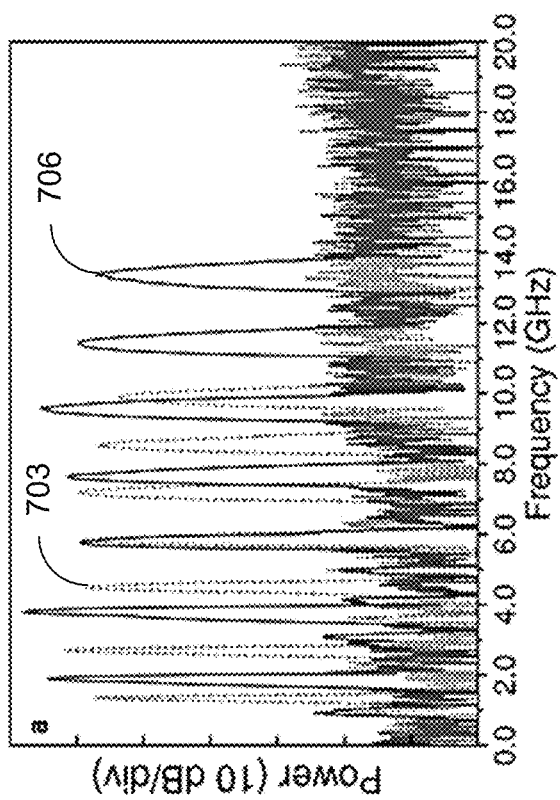

Another factor that determines passband frequencies, bandwidths and frequency spacings of the MWP multiband RF filter 100 is the amount of dispersion, as shown in equations (2) and (3). FIGS. 7A and 7B illustrate the above tuning performance of the passband bandwidth adjustment of the MWP multiband RF filter 100 while the length of the DCF 121 is changed, where the dashed filter profiles 703 were captured when a piece of 10.2-km DCF 121 is used and the solid filter profiles 706 were based on the use of a piece of 6.1-km DCF 121. The bandwidths of the passbands are broadened with the use of shorter DCFs. Other devices that provide chromatic dispersion can be used in place of the DCF such as, for example, a linearly chirped fiber Bragg grating.

As shown in FIG. 7A, with the same MZI 109 and Lyot loop filter 112, the seven evenly distributed passbands spanned a 14 GHz range, and the frequency spacing between two adjacent passbands was increased to 1.9 GHz. The average 3-dB bandwidth of the passbands was adjusted from 100 MHz (dashed 703) to 180 MHz (solid 706). With the same DCF length as in FIG. 7A, FIG. 7B shows the corresponding result when the right five passbands are continuously tuned through temporal adjustment in the MZI 109. The adjustment of the dispersion and length of PMF 142 of the system was to match the initial design requirements of various applications, and the filter tunability and reconfigurability were not relying on any physical change of the components.

The maximum simultaneous passband number can be further increased by using a two-stage Lyot loop filter, or cascading another optical comb filter to have more comb spacing combinations. A two-stage Lyot filter comprises two stages coupled between the two aligned polarizers 148 (FIG. 1). Each stage includes a piece of PMF 142, PC 145, and two optical circulators 151 (FIG. 1). The first stage of the two-stage Lyot filter can include a fixed polarization shift (45°) and PC 145 as in the Lyot filter 112 of FIG. 1, while the second stage can include an additional PC in series with the PMF 142. With a second stage added into the Lyot filter, additional selectable spacing can be achieved.

A photonics based continuously tunable and highly reconfigurable RF multiband filter has been described and experimentally demonstrated. In the embodiment of FIG. 1, the number of simultaneous passbands is adjustable between zero and seven, and can function as an all-block, single-band, dual-band, or multiband filter, while the passband frequencies can be continuously tuned over a 35 GHz range. The scheme utilizes a cascaded MZI 109 (FIG. 1) and Lyot loop filter 112 (FIG. 1) architecture, such that various optical comb spacing combinations can be obtained for the implementation of the MWP multiband RF filter 100 (FIG. 1). The MSSR of all the passbands was over 35 dB with sharp and uniform passband profiles, providing good filter selectivity. The MWP multiband RF filter 100 showed stable and consistent performance during the tuning and reconfiguring processes. Furthermore, the validation demonstrated a general methodology to implement MWP multiband RF filters through cascading multiple optical comb filters with various functionalities. Compared to the state-of-the-art RF multiband filters, this design significantly increases the simultaneous number of passbands as well as providing exceptional operational flexibility. To the best knowledge of the inventors, this is the first demonstration of an RF filter with such multiband dynamic capability. The MWP multiband RF filter 100 could dramatically enhance multiplexing capabilities, functionality, and performance of multiband RF systems, where the channel frequencies could dynamically adapt to diverse environments with various desired functions and spectral availability.

Evaluation of MWP Multiband RF Filter with Cascaded MZI

Figures 8A, 8B:
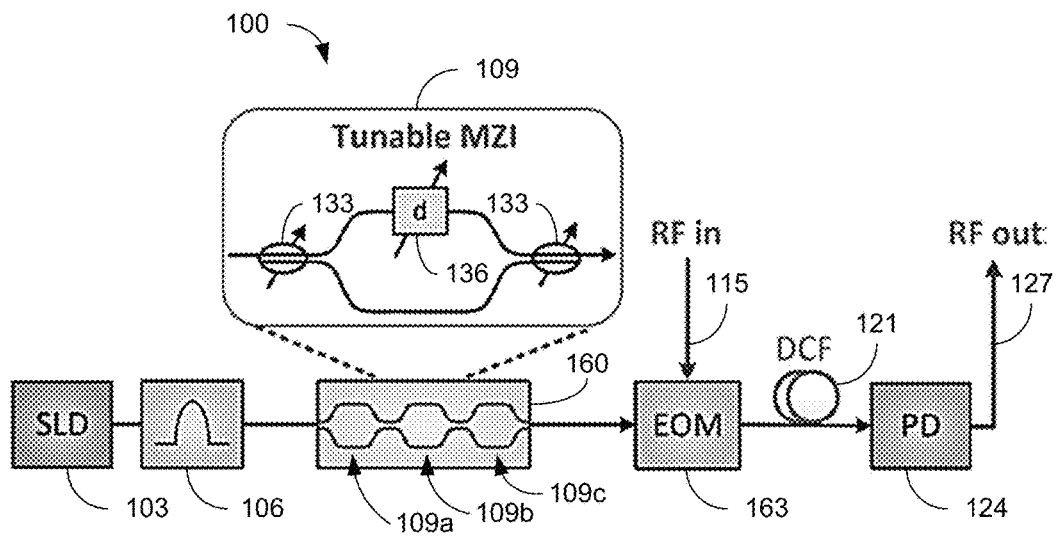

The MWP multiband filter can also be implemented with the use of a cascaded Mach-Zehnder Interferometer (MZI) structure. A highly tunable and reconfigurable microwave photonic multiband RF filter was implemented and tested. The experimental setup of a MWP multiband RF filter based on a cascaded MZI structure 160 is shown in FIG. 8A, with the inset illustrating the detail of each tunable MZI 109. The number of passbands is adjustable from 1 to 13, while the passband frequencies are continuously tunable from 0 to 20 GHz. The multiband filter 100 is based on the generation of high-order optical frequency combs from three cascaded Mach-Zehnder interferometers (MZI) 109. The example of FIG. 8A demonstrates a RF multiband filter 100 capable of achieving a large number of simultaneous passbands with tunability and reconfigurability.

A broadband light source 103 is spectrally sliced by three cascaded MZIs 109a-109c, and works as a multi-wavelength optical carrier. The RF signal 115 is then modulated onto the comb lines through an electro-optic modulator (EOM) 163, where each comb line contains a copy of the RF input signal. The EOM 163 can be, e.g., a PM (118 of FIG. 1A) or an intensity modulator. An intensity modulator was used to generate the results in the experimental setup. The modulated signal is then launched into dispersion compensating fiber (DCF) 121 such that each of the copies is properly delayed in time. A 4-nm optical Gaussian filter 106 is used to spectrally weight each of the comb lines, essentially weighting the amplitudes of the RF signal copies. The weighted and delayed copies are then added up and converted back to an RF signal 127 through a photo-detector 124. In this way, a finite impulse response RF filter with a bandpass profile can be obtained.

The center frequency of the passband is determined by equation (2), where $\Delta\omega$ is the spacing between each of the comb lines, and $\beta_2$ and $L_D$ are the dispersion and the length of the DCF 121. In order to generate multiple passbands at the same time, an optical frequency comb with multiple comb spacings is needed. This can be achieved by cascading three MZIs 109a-109c in series and simultaneously generating multiple path length differences. In particular, when the light travels through the first MZI 109a, an optical comb with a comb spacing of $\Delta\omega=2\pi c/nd_1$ is generated, where n is the refractive index of the fiber and $d_1$ is the length difference between the two branches of the MZI 109a, and c is the speed of light. By cascading a second MZI 109b with a branch length difference of $d_2$ and adjusting the coupling ratios of the tunable couplers 133, four length difference combinations can be obtained at the same time, which are $d_1$, $d_2$, $d_1+d_2$, and $d_1-d_2$. As a result, four different comb spacings were obtained, which corresponds to four RF passbands at different frequencies. When three MZIs 109a-109c are cascaded, up to 13 different combinations can be obtained and resulting in 13 different passbands. The table of FIG. 8B summarizes the passband combinations for one, two and three MZIs 109. In other implementations, two or more MZIs 109 can be cascaded to achieve different comb combinations. FIG. 8C shows an example of the measured optical comb spectrum generated by the three cascaded MZIs 109a-109c. A tunable optical coupler 133 with adjustable coupling ratio can be used to vary the power ratio between the two MZI branches to achieve different extents of interference, such that amplitude of the resultant passband can be adjusted. Furthermore, since the length differences ($d_1$, $d_2$ and $d_3$) can be continuously adjusted by tunable delay lines 136 in each MZI 109, all the resulting passbands are continuously tunable in frequency.

Figure 9C:
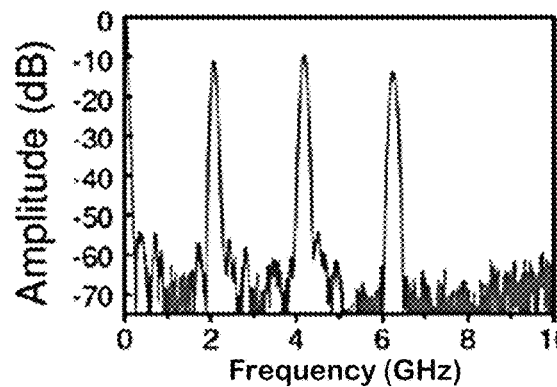
Figure 9D:
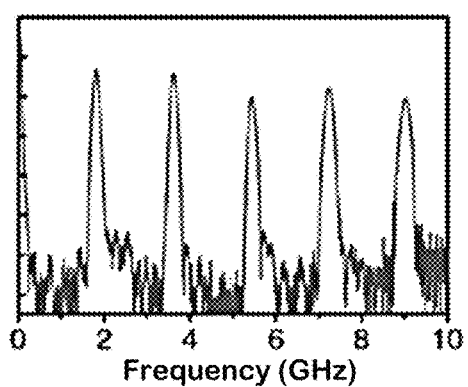
Figure 9E:
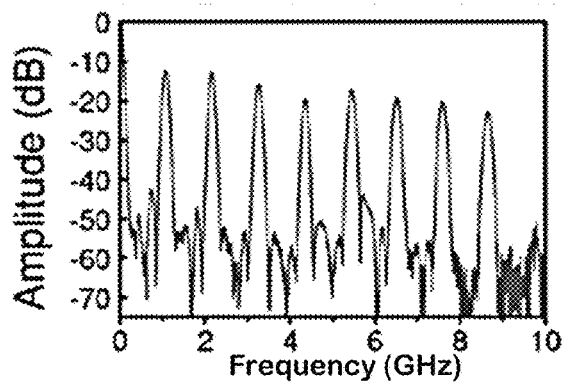
Figure 9F:
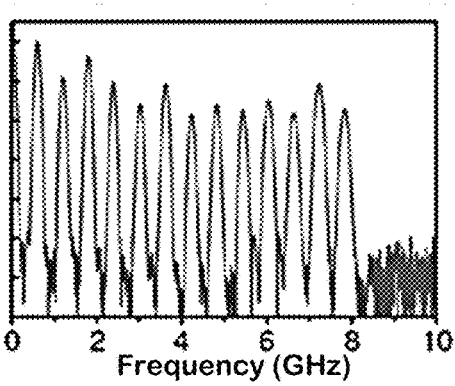
Figure 9G:
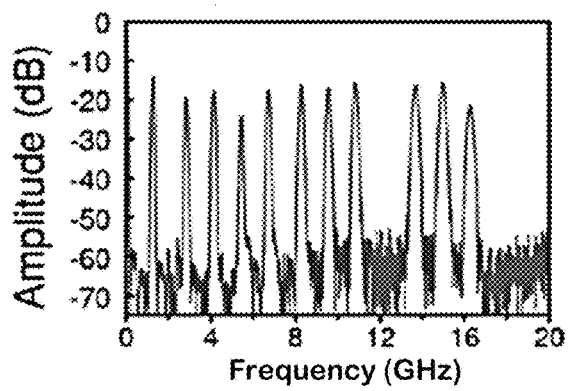
Figure 9H:
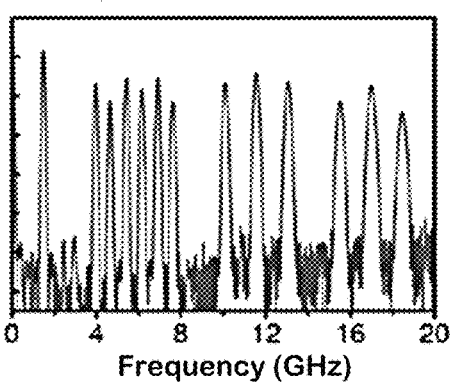

The measured results of different passband combinations are shown in FIGS. 9A-9H. By adjusting the tunable couplers inside the three MZIs 109a-109c (e.g., enabling/bypassing some of them), the MWP filter 100 can be reconfigured to have various simultaneous passbands. A single bandpass filter is shown in FIG. 9A, which can be achieved by setting the tunable couplers 133 inside the second MZI 109b and third MZI 109c to be 100:0 such that these two interferometers are bypassed. As a result, only one single bandpass filter is generated from the first MZI 109a. When the first and second MZIs 109a and 109b are enabled, four passbands are observed as shown in FIG. 9B. The four-passband filter can turn into a three-passband filter by adjusting the tunable delay line 136 in the second MZI 109b, such that two of the passbands are tuned to the same frequency and are overlapping with each other, as shown in FIG. 9C. When all the three MZIs 109a-109c are employed, all of the thirteen passbands listed in the table of FIG. 8B are obtained. The 13 passbands can be set to be evenly distributed from 0 to 8 GHz with same frequency spacing of 0.6 GHz, as indicated in FIG. 9F. Alternatively, the passbands can be adjusted to overlap with each other, such that various other passbands combinations can be achieved, as shown in FIG. 9D (5 passbands) and FIG. 9E (8 passbands). FIGS. 9G and 9H illustrate the continuous tunability that can be achieved, with the passbands tuned to different positions and spread across a 20 GHz frequency range. The frequency tuning range is governed by the adjustable range of the delay lines 136. In the setup of FIG. 8A, up to 35 GHz frequency tuning was achieved with the use of a 600 ps delay line 136. Furthermore, all the passbands exhibited good filter selectivity, with sharp bandpass profiles and over 35 dB sidelobe suppression.

The examination results demonstrate that a tunable MWP multiband RF filter with up to 13 simultaneous passbands can be achieved using three cascaded MZIs 109a-109c. The number of simultaneous passbands is adjustable from 1 to 13, and the passband frequencies are continuously tunable over 20 GHz. Other combinations of cascaded MZIs 109 (e.g., two, four, etc.) are possible. Furthermore, the cascaded MZI structure of FIG. 8B is an excellent candidate for integration into a wide range of applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A multiband radio frequency (RF) filter, comprising:
    a Lyot loop filter comprising a tunable birefringence loop comprising a circulator, a birefringent device, and a polarization controller (PC), the Lyot loop filter configured to generate an optical comb based at least in part upon an input optical signal, the birefringent device, and a polarization rotation angle of the PC; and
    a tunable Mach-Zehnder interferometer (MZI) providing the input optical signal to the Lyot loop filter, the tunable MZI comprising a tunable delay line configured to adjust comb spacing of the optical comb.

2. The multiband RF filter of claim 1, wherein the tunable MZI comprises a tunable coupler coupled to first and second branches of the tunable MZI, the first branch including a tunable delay line and the second branch comprising a fixed delay line.

3. The multiband RF filter of claim 2, wherein the tunable coupler is configured to continuously adjust a power ratio between the first and second branches of the tunable MZI to dynamically tune passband amplitude.

4. The multiband RF filter of claim 2, wherein the tunable MZI comprises a coupler can that combines outputs of the first and second branches for interference.

5. The multiband RF filter of claim 1, wherein the birefringent device comprises a length of polarization maintaining fiber (PMF), and the PC is coupled to a distal end of the PMF via the circulator.

6. The multiband RF filter of claim 5, wherein the PC is configured to adjust the polarization rotation angle in a range from 0° to 90°.

7. The multiband RF filter of claim 5, wherein the input optical signal is provided to a proximal end of the PMF via a loop coupling circulator of the Lyot loop filter.

8. The multiband RF filter of claim 1, wherein the Lyot loop filter comprises a second tunable birefringence loop comprising a second circulator and a second PC, the second tunable birefringence loop coupled in series by a second loop coupling circulator.

9. The multiband RF filter of claim 8, wherein the second tunable birefringence loop comprises a second PMF, and the second PC is coupled to a distal end of the second PMF via the second circulator.

10. The multiband RF filter of claim 8, wherein an output from the tunable birefringence loop is provided to a proximal end of the second PMF via the second loop coupling circulator.

11. The multiband RF filter of claim 10, wherein the output from the tunable birefringence loop is provided to the proximal end of the second PMF via a third PC.

12. The multiband RF filter of claim 1, comprising a phase modulator (PM) configured to generate a modulated tap signal by modulating the optical comb by a RF input signal.

13. The RF filter of claim 12, comprising a photo-detector (PD) configured to generate a RF output signal based upon the modulated tap signal.

14. The RF filter of claim 13, comprising a piece of dispersion compensating fiber (DCF) between the PM and the PD to provide a linear delay for wavelengths of the modulated tap signal.

15. A multiband radio frequency (RF) filter, comprising:
    a first tunable Mach-Zehnder interferometer (MZI), the first tunable MZI configured to generate a first tunable output signal from an input signal, the first tunable MZI comprising a tunable delay line configured to adjust comb spacing of the first tunable output signal; and
    a second tunable MZI in series with the first MZI, the second tunable MZI configured to generate a second tunable output signal from the first tunable output signal from the first tunable MZI, the second tunable MZI comprising a tunable delay line configured to adjust comb spacing of the second tunable output signal.

16. The multiband RF filter of claim 15, wherein the first and second tunable MZIs comprise a tunable coupler coupled to first and second branches of that tunable MZI, the first branch including a tunable delay line and the second branch comprising a fixed delay line.

17. The multiband RF filter of claim 16, wherein the first and second tunable MZIs comprise a second tunable coupler can that combines outputs of the first and second branches for interference.

18. The multiband RF filter of claim 15, comprising a third MZI in series with the second tunable MZI, the third MZI configured to generate a third tunable output signal from the second tunable output signal from the second tunable MZI, the third MZI comprising a tunable delay line configured to adjust comb spacing of the third tunable output signal.

19. The multiband RF filter of claim 18, comprising an electro-optic modulator (EOM) configured to generate a modulated tap signal by modulating the first tunable output signal, the second tunable output signal or the third tunable output signal by a RF input signal.

20. The multiband RF filter of claim 19, comprising a photo-detector (PD) configured to generate a RF output signal based upon the modulated tap signal.

* * * * *